United States Patent

Girmay

[11] Patent Number: 5,920,683
[45] Date of Patent: Jul. 6, 1999

[54] IMAGE ENHANCEMENT SYSTEM FOR HIGH ADDRESSABILITY PRINTING

[75] Inventor: Girmay K. Girmay, La Mirada, Calif.

[73] Assignee: Xerox Corporation, Stamford, Conn.

[21] Appl. No.: 08/883,946

[22] Filed: Jun. 27, 1997

[51] Int. Cl.⁶ .................................................. H03K 9/08
[52] U.S. Cl. ........................................ 395/109; 358/298
[58] Field of Search .................................. 395/107–109; 382/266–270; 358/296, 298–300, 429, 534–536

[56] References Cited

U.S. PATENT DOCUMENTS

| | | | |
|---|---|---|---|
| 4,063,234 | 12/1977 | Arn et al. | 340/334 |
| 5,144,338 | 9/1992 | Sakano | 346/108 |
| 5,265,196 | 11/1993 | Haneda | 395/109 |
| 5,379,321 | 1/1995 | Girmay | 375/22 |
| 5,410,414 | 4/1995 | Curry | 358/298 |
| 5,502,419 | 3/1996 | Kawasaki et al. | 332/109 |
| 5,504,462 | 4/1996 | Clanciosi et al. | 332/109 |

*Primary Examiner*—Thomas D Lee
*Assistant Examiner*—Stephen Brinich
*Attorney, Agent, or Firm*—William Propp

[57] ABSTRACT

An apparatus enhances the image in a high addressability printer by generating phase signals from a pulse width modulator and a programmable delay or buffer which are XORed with adjacent phase signals and combined with a corresponding data signal to form SET and RESET signals. The SET and RESET signals are used to form a phase and width modulated serial data signal.

5 Claims, 5 Drawing Sheets

IMAGE ENHANCEMENT SYSTEM FOR HIGH ADDRESSABILITY PRINTING

BACKGROUND OF THE INVENTION

This invention relates to an image enhancement system for high addressability printing and, more particularly, to an apparatus for enhancing image data through pulse width modulation and delayed phase signals to improve subpixel addressability.

Digital reproduction, transfer or display of original images on image output terminals begins by creating a digital representation of an original image. Commonly, the digital representation becomes a bitmap in which multiple grey levels in the original image are reproduced by varying the spatial frequency of halftone dots. Continuous tone images or image portions are typically represented in binary form by creating these halftone dots, where each dot represents a grey level density within an area of picture elements (pixels).

A continuing goal in the art is to improve the image quality of printers. Pulse width modulation is one high addressability technique to increase printer resolution without modifying the physical printer device. Images are stored in the form of image data, the image data being represented by pixels. To increase the resolution, each pixel is divided into N subpixels.

High addressability systems typically have two solutions, each with its own problems. One high addressability system will provide high resolution placement and width modulation of the subpixels but has a limited data bit rate. The other high addressability system will provide multiple subpixel placement with a high data bit rate but with undesirable side effects relating to electromagnetic compatibility.

It is an object of this invention to provide an apparatus for enhancing image data for a high addressability printing system with a high data bit rate and high speed with electromagnetic compatibility.

SUMMARY OF THE INVENTION

In accordance with the present invention, an apparatus enhances the image in a high addressability printer by generating phase signals from a pulse width modulator and a programmable delay or buffer which are XORed with adjacent phase signals and combined with a corresponding data signal to form SET and RESET signals. The SET and RESET signals are used to form a phase and width modulated serial data signal.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
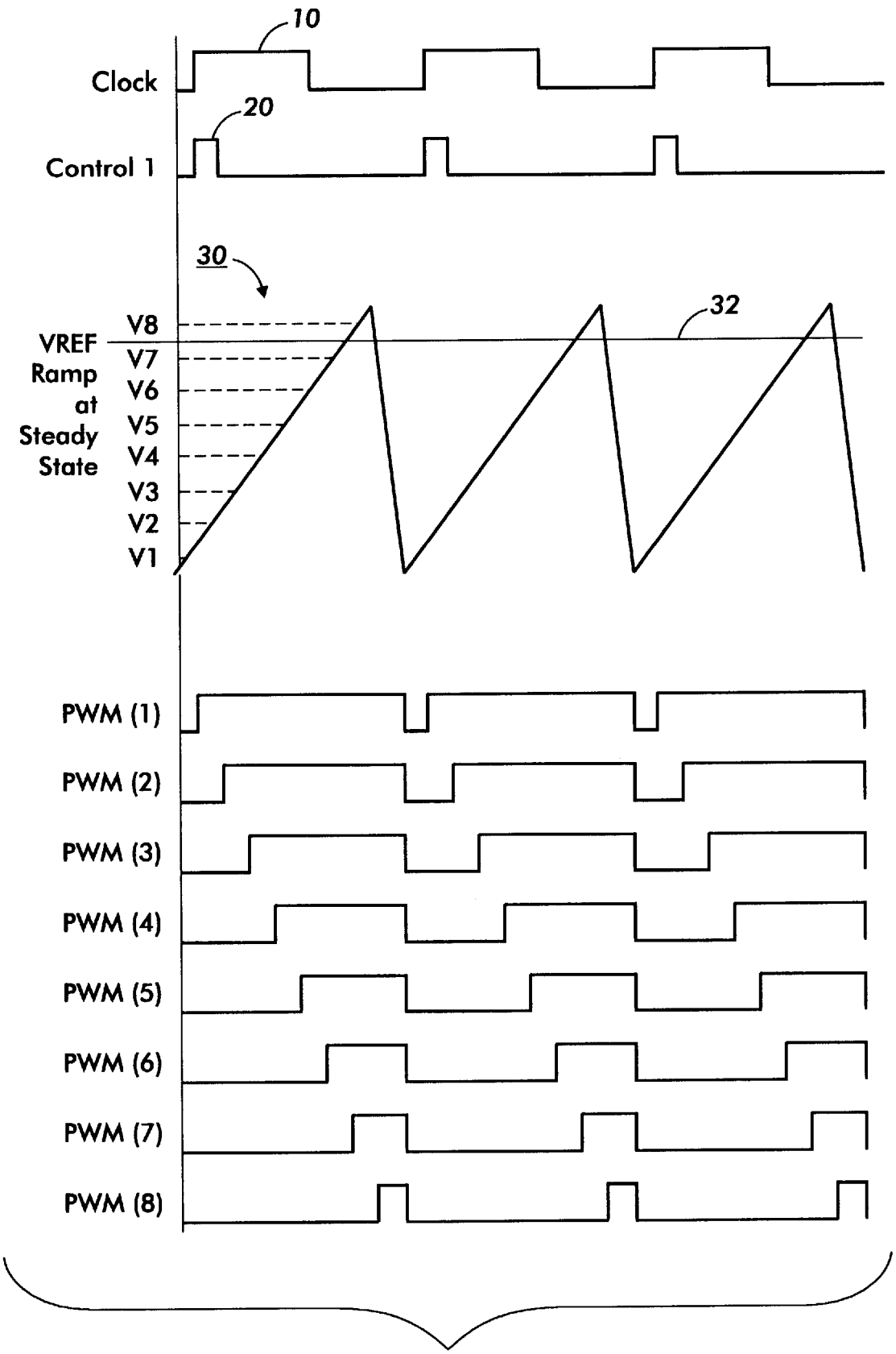
FIG. 1 is a detailed timing diagram of the image enhancement system of this invention.

Reference is now made to FIG. 1, wherein there is illustrated the detailed waveshapes of the pulse width modulation generator of the image enhancement system of this invention.

From the top of FIG. 1, the Pixel Clock period 10 is measured from one positive going wave front to the next. Each Pixel Clock is used to create a short narrow Control 1 signal 20 that starts at clock time and lasts long enough to bring the ramp waveshape 30 down to zero. The ramp having a constant slope is compared against the variable threshold VREF 32, which is a DC level within the pulse width modulation circuit which controls the ramp rise time.

Next, the ramp is compared with respect to N dc levels. In this example, there are 8 dc levels that are fed to 8 corresponding comparators. The comparators toggle from LOW to HIGH as the ramp signal exceeds the dc level. V1 is the lowest reference level that can be produced, which results in the longest pulse output. V8 is the highest reference level that can be produced, which results in the shortest pulse output.

Figure 2:
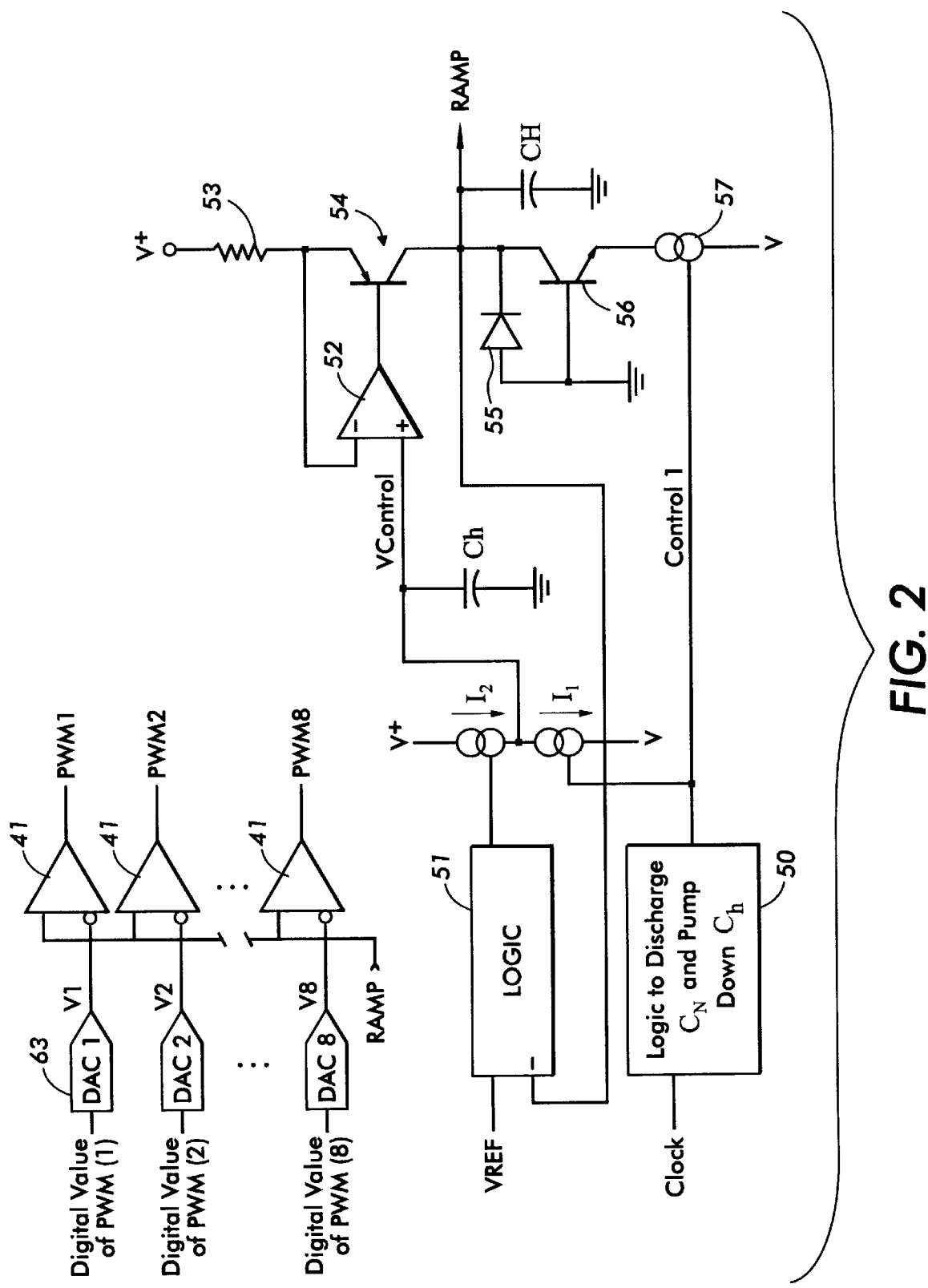
FIG. 2 is a schematic block diagram of the pulse width modulation generator of this invention.

FIG. 2 illustrates a pulse width modulation generator 10 which is the subject of U.S. Pat. No. 5,379,321, commonly assigned as the present invention and herein incorporated by reference.

First the Pixel Clock is input to the LOGIC 50 which generates the fixed Control 1 signal. This signal is coupled to the current generator 57 which turns on for the duration of the positive portion of the Control 1 signal to discharge first capacitor CH, through transistor 56 and diode 55, to zero at the beginning of each cycle. Control 1 also turns on first current generator I 1 at the same time to discharge second capacitor Ch by a small predetermined amount (not to zero). At the end of the Control 1 signal, the residual positive charge on second capacitor Ch is coupled to the +input of operational amplifier 52, transistor 54 and resistor 53, all of which constitute a current generator which charges up first capacitor CH to create a ramp. When this ramp is equal to the VREF level, the logic block 51 will output a signal to second current generator I 2 to charge up second capacitor Ch at a predetermined rate. At this point, the pulse width modulation circuit will discharge and the ramp return to zero. This will continue until the start of the next clock pulse.

The outcome of this entire process is that the slope of the ramp is a function of the clock frequency. The longer the clock period, the longer the ramp will become to maintain the output duty cycle in spite of a change in clock frequency.

N different sets of output pulses can be generated in parallel. In this illustrative example, eight different sets of output PWM pulses are generated parallel as shown in FIG. 1. The eight pulses will provide 8 subpixel addressability for the image enhancement system. Digital values of PWM (1), PWM (2), . . . PWM (N) . . . , PWM (7) and PWM (8) are applied to eight digital to analog converts (DACs) 63, the outputs being eight voltage levels, V1 to V8. These levels are compared to the ramp by comparators 41, the outputs of which are the eight digital output PWM signals, PWM 1 to PWM 8. PWM 1 is the long output pulse shape if V1 is used. PWM 8 is the short output pulse shape if V8 is used. The choice of DACs allows a very precise selection of voltage relationships, which are especially needed if the timing relationship is non-linear, i.e. V2−V1 ≠V8−V1.

Figure 3:
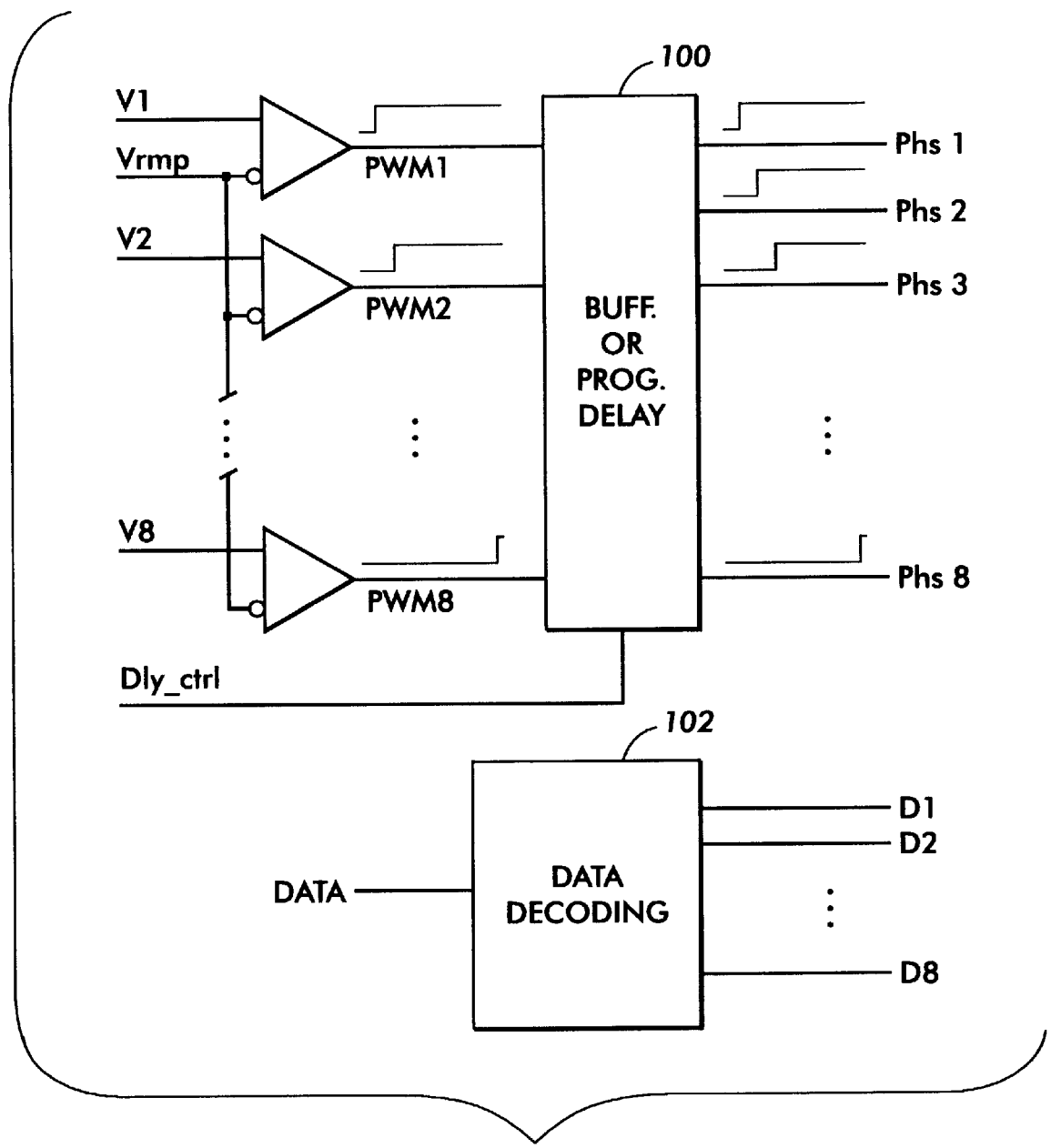
FIG. 3 is a schematic block diagram of the buffer or programmable delay line block and data decoder of this invention.

The eight digital output PWM signals, PWM 1 to PWM 8, from the comparators 41 in FIG. 2 are input to the programmable delay or buffer 100 of FIG. 3. The eight digital output PWM signals make a single positive transition per pixel. This transition corresponds to the subpixel boundaries. The programmable delay/buffer allows the subpixel boundaries to be selectively set or selectively adjusted. The delay control signal is generated by 8 devices with 4 bits of control delay each. This delay control signal is available from the operator to set through switches or a byte of control data.

At high bit rates, where variations in comparator delays may serious undesirable effects on the image quality of the pixel, programmable delays may be essential. At low bit rates, a simple buffer is sufficient since very limited buffer and comparator delay uncertainties may be compensated for by changing the DAC's digital value.

The buffer outputs eight phase signals, Phs(i), (Phs1 to Phs8) based on the eight PWM signals.

Meanwhile, the data decoder 102 of FIG. 3 receives an input video data signal, D, typically eight bits in parallel mode, and generates a set of eight data signals, Di, (D1 to D8). The major function performed by the decoder is to transform the data input D into a data format D1 to D8 such that D1 to D8 represent the equivalent serial data stream to be printed.

Figure 4:
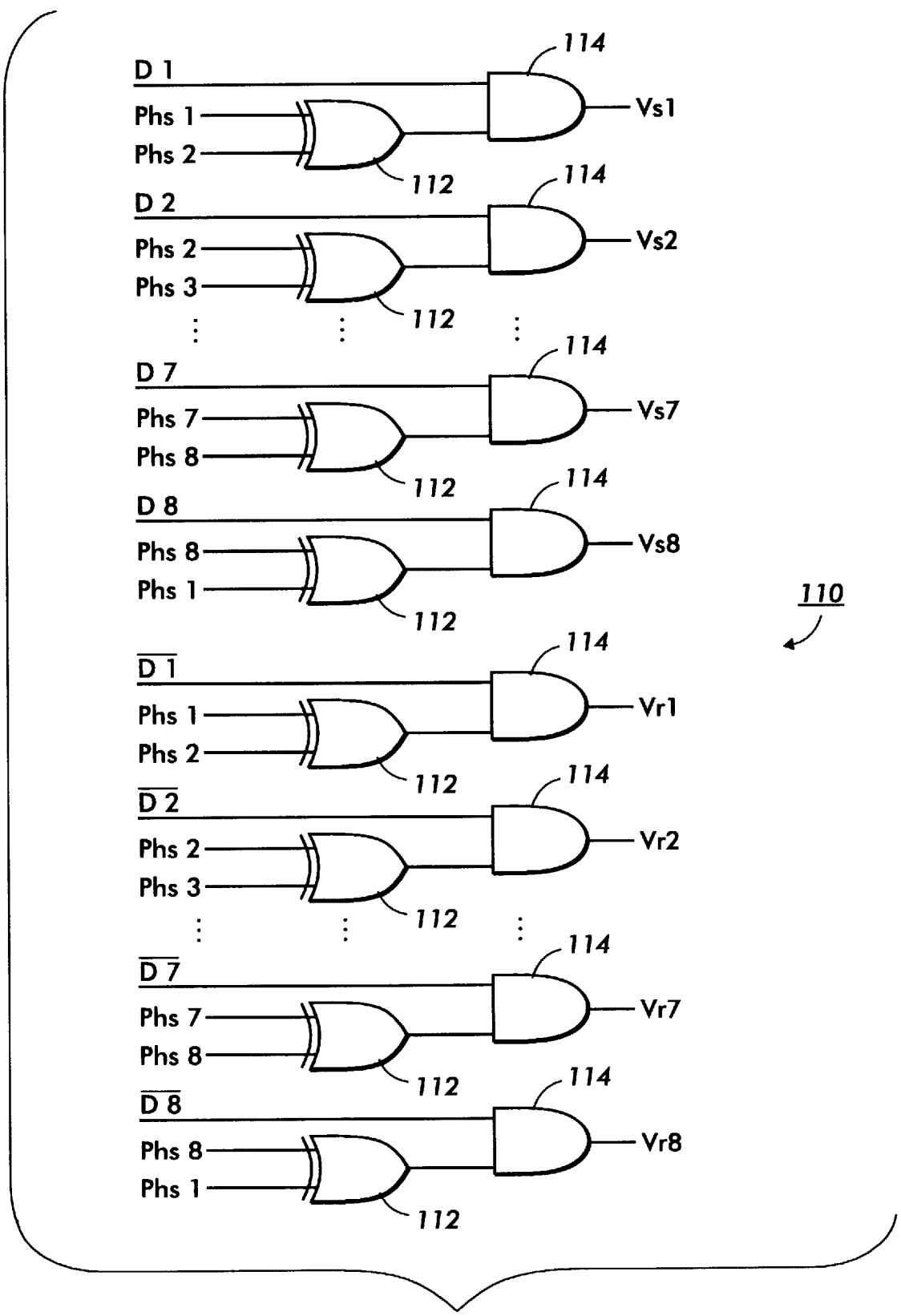
FIG. 4 is a schematic block diagram of the phase and data processor of this invention.

The eight phase signals Phs(i) (Phs1 to Phs8) from the delay buffer 100 of FIG. 3 and the set of eight data signals Di (D1 to D8) from the data decoder 102 of FIG. 3 are then inputted into the phase and data comparators 110 of FIG. 4.

Adjacent phases Phs (i) and Phs (i+1) from the delay buffer 100 of FIG. 3 are input to an XOR gate 112. The resulting logic level from the XOR gates is combined at gate 114 with the respective data value Di from the data decoder 102 to produce the Video SET Vs(i) and Video RESET Vr(i) data. The inverse versions of Di, Di, are processed in a similar fashion where Phs(i) and Phs(i+1) are XORed and the output combined at gate 114 to produce the Video RESET Vr(i) data.

The phase and data comparators 110 of FIG. 4 will produce eight individual video SET Vs(i) signals (Vs1 to Vs8) and eight individual video RESET Vr(i) signals (Vr1 to Vr8). Vs(i) will be the subpixel (i) start point and Vr(i) will be the subpixel (i) end point.

Figure 5:
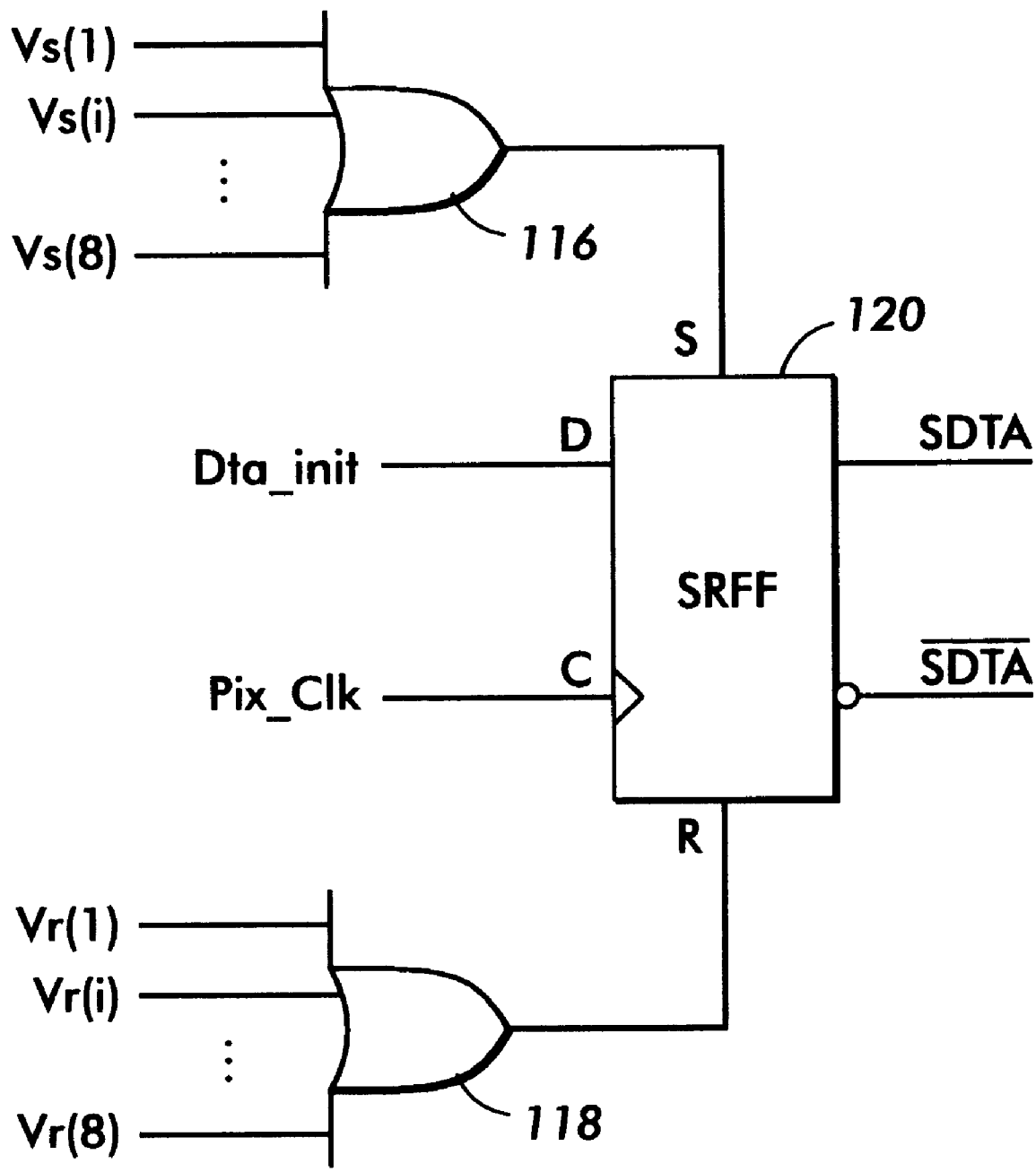
FIG. 5 is a schematic block diagram of the Set-Reset Flip-Flop (SRFF) of this invention.

The eight individual video SET Vs(i) signals are combined by a first OR gate 116 in FIG. 5 to form a video SET signal and the eight individual video RESET Vr(i) signals are combined by a second OR gate 118 to form a video RESET signal. The video SET and RESET signals are inputted to the SET and RESET inputs of the Set-Reset Flip-Flop 120 (SRFF).

The SRFF will output the Serial Data SDTA and SDTA signals, which are the image enhanced, phase and width modulated, signals of the invention.

In addition, the initial data signal, dta init, may be introduced as a way to introduce over-ride capabilities. The full functionality of this signal will require a logic qualifier to disable SET and RESET inputs in that mode of operation. The pixel clock signal would also be input into the Set-Reset Flip-Flop 120 along with the dta init signal.

The video SET signals and video RESET signals from the image enhancement system prevent inter-subpixel interference and intra-pixel interference providing for a smooth transition within individual pixels and between individual pixels. The video SET signals and video RESET signals allow only the enabled subpixels to be active which provides a minimum emission level.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

I claim:

1. An image enhancement system for a high addressability system comprising a pulse width modulation generator for generating pulse width modulated signals from a pixel clock, a programmable delay or buffer for producing phase signals from said pulse width modulated signals, a data decoder for generating a set of data signals from an initial data signal, a phase and data processor for generating a logic level from adjacent phase signals, said logic level being combined with a corresponding data signal to form a video SET data signal and a video RESET data signal, a plurality of said video SET data signals being combined to form a video SET signal, a plurality of said video RESET data signals being combined to form a video RESET signal, and combining means for combining said video SET signal and said video RESET signal to form a phase and width modulated serial data signal.

2. The image enhancement system for a high addressability system of claim 1 wherein said combining means is a Set-Reset Flip-Flop (SRFF).

3. The image enhancement system for a high addressability system of claim 1 wherein said phase and data processor has at least one XOR gate for generating a logic level from adjacent phase signals.

4. The image enhancement system for a high addressability system of claim 1 wherein said programmable delay or buffer includes a programmable delay buffer.

5. The image enhancement system for a high addressability system of claim 1 wherein said programmable delay or buffer includes at least one digital to analog converter (DAC) and a buffer.

* * * * *